United States Patent [19]

Jenkins

[11] Patent Number: 4,818,975
[45] Date of Patent: Apr. 4, 1989

[54] GENERATOR STATOR CORE TEMPERATURE MONITOR

[75] Inventor: Maurice A. Jenkins, Casselberry, Fla.

[73] Assignee: Westinghouse Electric Corp., Pittsburgh, Pa.

[21] Appl. No.: 171,352

[22] Filed: Mar. 21, 1988

[51] Int. Cl.$^4$ ............................................. G08B 21/00
[52] U.S. Cl. ..................................... 340/584; 340/531; 340/592
[58] Field of Search .................. 340/584, 592, 531

[56] References Cited

U.S. PATENT DOCUMENTS

| | | | |
|---|---|---|---|
| 4,203,326 | 5/1980 | Gottlieb et al. | 340/584 |
| 4,364,032 | 12/1982 | Narato et al. | 340/584 |
| 4,379,289 | 4/1983 | Peek | 340/531 |
| 4,577,184 | 3/1886 | Hodara et al. | 340/531 |
| 4,594,581 | 6/1986 | Matoba | 340/531 |
| 4,733,225 | 3/1988 | Uematsu et al. | 340/584 |

Primary Examiner—Glen R. Swann, III
Attorney, Agent, or Firm—M. G. Panian

[57] ABSTRACT

A temperature monitor for a generator stator core is disclosed. The monitor comprises a light source which generates a light beam, heat sensitive targets which receive the light beam and which either block the light beam or allow the light beam to pass through, depending on the temperature in the stator core, fiber optic receivers associated with the target which detect whether the light beam has passed through or been blocked by the targets and which also convert the light beams into responsive electrical signals, and a computer which receives the responsive electrical signals from the receiver, converts the responsive electrical signals into processed electrical signals, and outputs data to a user, whereby temperature conditions in the stator core can be monitored.

19 Claims, 4 Drawing Sheets

4,818,975

GENERATOR STATOR CORE TEMPERATURE MONITOR

BACKGROUND OF THE INVENTION

1. Field Of The Invention:

This invention relates generally to temperature monitoring of the stator core iron within an electric generator, and more specifically to a device that utilizes a heat sensitive means and fiber optics to monitor hydrogen gas temperatures in the air gap of a radially cooled stator core or at the discharge end of an axially cooled stator core.

2. Description Of The Prior Art:

Temperatures of generator stator cores must be monitored in order to determine if safe operating conditions are being maintained. If temperatures in the core get too high, lamination insulation can break down and result in metal failure of the core.

A known method of generator stator core temperature monitoring is accomplished by the incorporation of thermocouples into the generator during manufacture of the stator core. This method, however, is impractical to retrofit in currently operating generators.

If it is desired to retrofit a currently operating generator, the prior art teaches using a "core monitor." This device detects burnt generator stator core lamination insulation material in the gas flow of the generator. There are several drawbacks with this device, however. First, it does not provide a value for the temperatures inside the generator stator core. Secondly, this device indicates problems only after insulation has already started to breakdown.

Thus, there remains a need for a monitoring device that not only can be easily retrofit into existing generators but that is also easy to manufacture, install, and use.

SUMMARY OF THE INVENTION

The Generator Stator Core Temperature Monitor of the present invention meets the above described need. The monitor measures the temperature of hydrogen gas ($H_2$) as it exits the generator stator core. The monitor generally comprises a light source means which generates a light beam, receiver means associated with the light source means which converts the light beams into responsive electrical signals, and monitoring means which receives the responsive electrical signals from the receiver means, converts the responsive electrical signals into processed electrical signals and outputs data to a user, whereby temperature conditions in the generator stator core can be monitored.

In one embodiment the monitor comprises a light source means which generates a light beam, heat sensitive target means which receive the light beam and which either block the light beam or allow the light beam to pass through, depending on the temperature of the stator core, receiver means associated with the target means which detects whether the light beam has passed through the target means or whether the light beam has been blocked by the target means and which also converts the light beams into responsive electrical signals, and monitoring means which receives the responsive electrical signal from the receiver means, converts the responsive electrical signals into processed electrical signals, and outputs data to a user, whereby temperature conditions in the stator core can be monitored.

An alternate embodiment is also disclosed which comprises a heat sensitive bladder which expands or contracts based on the ambient temperature inside the generator and which has mounted thereon a fiber optic emitter means which transmits a light beam, fiber optic receiver means which are positioned so to receive light beams from the emitter means and which convert said light beams into responsive electrical signals, and monitoring means which receive the responsive electrical signals from the receiver means, convert the responsive electrical signals into processed electrical signals and output data to a user, whereby temperature conditions in the generator stator core can be monitored.

It is an object of the invention to provide a device which allows for retrofitting of an effective temperature monitoring device.

It is a further object of the invention to provide a monitoring device which indicates high temperatures before there is generator insulation deterioration.

It is a further object of the device to utilize fiber optics and heat sensitive plastic targets to quickly and easily monitor generator stator core temperatures.

It is a further object of the invention to provide a plurality of temperature sensitive targets to indicate different temperature conditions within the generator stator core.

It is a further object of the invention to provide an alternate embodiment which utilizes a bladder filled with a fluid having a high coefficient of thermal expansion in place of the plastic targets.

These and other objects of the invention will be fully understood from the following description of the invention with reference to the drawings appended to this Application.

DESCRIPTION OF THE PREFERRED EMBODIMENTS

Figure 1:
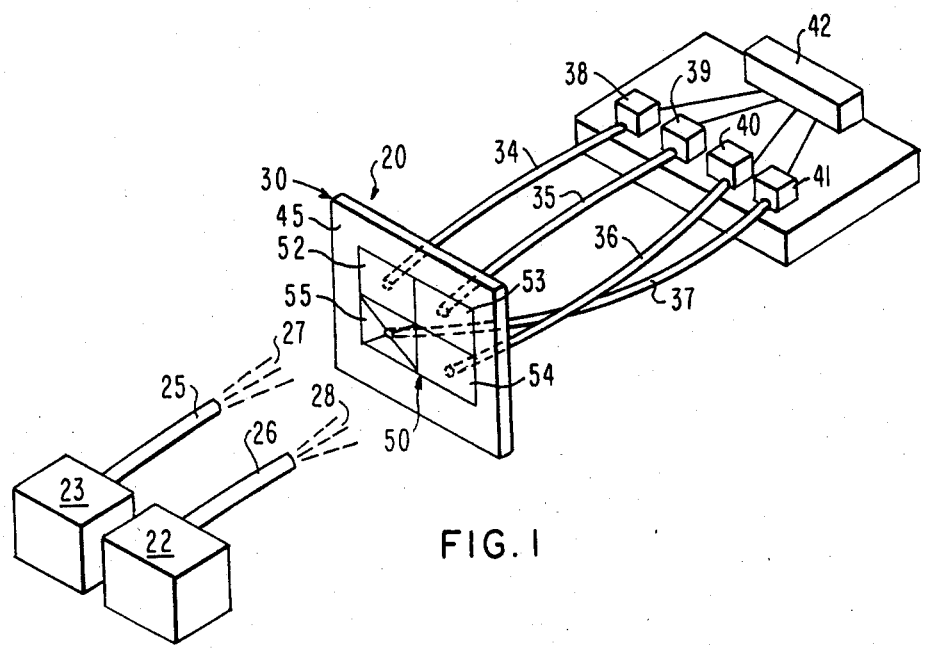
FIG. 1 is a partially schematic perspective view of an embodiment of the temperature monitor of the present invention.
Figure 2:
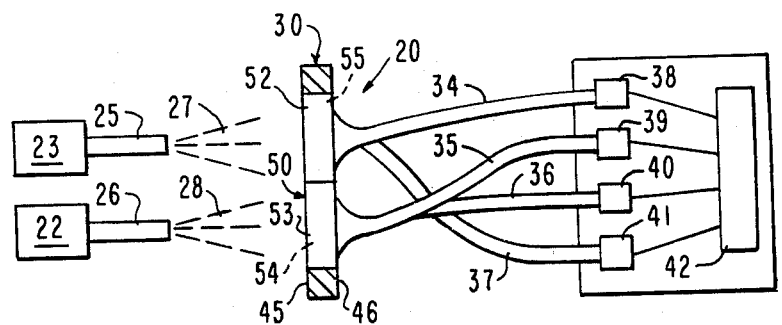
FIG. 2 is a partial schematic top plan view with part in section of the monitor shown in FIG. 1.
Figure 3:
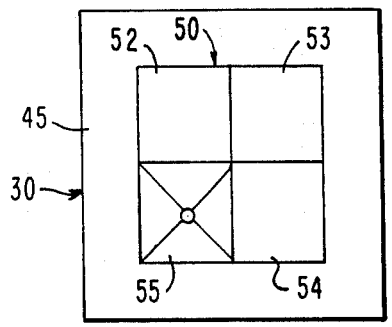
FIG. 3 is a front elevational view of the target pad of the embodiment shown in FIG. 1.
Figure 4:
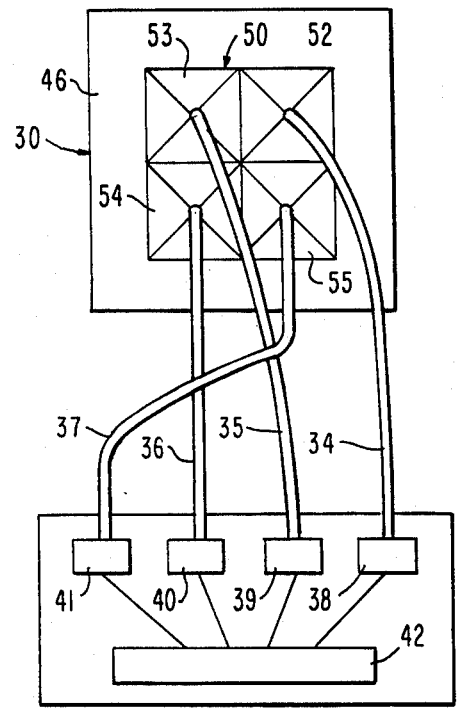
FIG. 4 is a rear elevational view of the target pad of the embodiment shown in FIG. 1.

Referring now to FIGS. 1-4, there is shown the Generator Stator Core Temperature Monitor 20 of the present invention. The Monitor 20 is comprised of a light source means 22 and 23 respectively, emitter fiber optic cables 25 and 26, target means 30 to which light from the light cables 25 and 26 is directed, receiver fiber optic means including associated cables 34-37 and photodiode means 38-41 and monitoring means 42.

The light source means 22 and 23 is preferably a light emission system well known to those skilled in the art which is capable of delivering a steady and constant beam of light to the fiber optic cables 25 and 26 respectively. The light beams will emerge from the fiber optic cables at outlets 27 and 28, respectively.

Light from either cable 25 or 26 will be effective to illuminate the entire target means 30. Preferably, separate light source means 22 and 23 are provided in case area, external to the generator. This will not only protect the light source means 22 and 23 from high stator core temperature and elevated voltage and magnetic flux fields, but will also provide easy access for repair or replacement of the light source means 22 and 23.

The target means 30 is preferably flat and has a front surface 45 and a back surface 46. Disposed in the target means 30 is target framing member 50 having four heat sensitive plastic targets 52-55 disposed thereon. These targets 52-55 provide thermally reversible heat sensitive mediums which are transparent to light within limited specified temperature ranges. These targets are commercially available from American Thermometer Co., Inc. and can be a cholesteric liquid crystal system which respond to changes in ambient temperature by the blockage or transmission of the visible light spectrum. These targets 52-55 will be explained in detail hereinbelow.

Disposed in the framing member 50 of the target means 30 are fiber optic receiver cables 34-37 associated with each of the targets 52-55, respectively. These cables 34-37 are capable of receiving a light beam and transmitting this light beam to the photodiode means 38-41. As can best be seen in FIG. 2, each of the cables 34-37 is attached to the backside 46, of the target means in such a way as to be able to receive light beams only through the target 52-55 with which it is associated.

Disposed on the opposite end of each of the fiber optic cables 34-37 are associated photodiodes 38-41. As with the light source means 22 and 23, photodiode means 38-41 are preferably located in a benign low temperature region external to the generator to not only protect them from high temperature, voltage, and magnetic flux levels but also to facilitate repair and replacement. These photodiodes 38-41 are conventionally known, and act to convert beams of light into responsive electrical signals. These electrical signals are then input to the monitoring means 42.

The monitoring means 42 receives the responsive electrical signal from the receiver means, converts the responsive electrical signal to processed electrical signals which can output data to a user based on the sequence of the responsive electrical signals. This way temperature conditions in the stator core can be monitored. The monitoring means 42 is preferably a microprocessor or other means which can be programmed to process and output the processed electrical signals.

In operation, the targets 52-55 will allow light to pass through when the ambient temperature is within specified limited discrete temperature ranges. Once the temperature in the generator stator core reaches the specified level, the specified target will allow light beams emanating from fiber optic cable 25 and/or 26 to pass through this target. This will be more fully understood in the discussion of the example hereinbelow.

Figure 5:
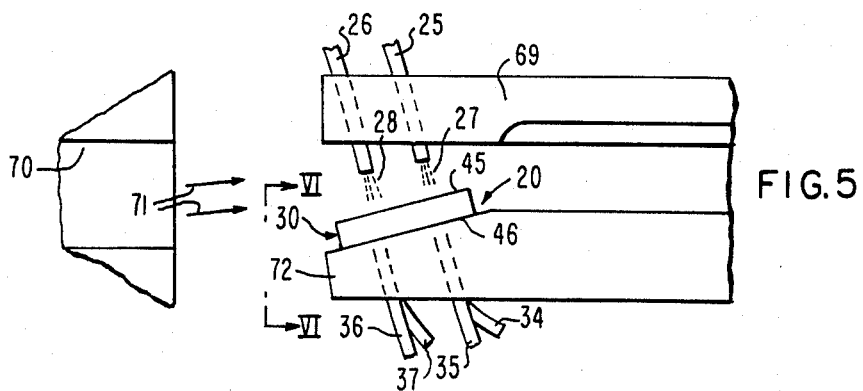
FIG. 5 is a cross-sectional view of part of the generator stator core showing the temperature monitor mounted near the hydrogen gas discharge vents of the generator core.
Figure 6:
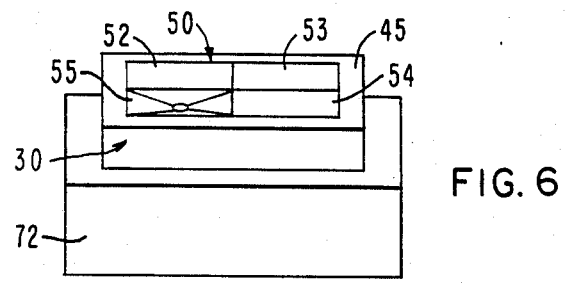
FIG. 6 is an elevation view of the monitor as mounted on the housing looking in along the line 6—6 in FIG. 5.

FIGS. 5 and 6 show a portion of a generator core and a preferred positioning of the device. As can be seen, the light source cables 25 and 26 can be mounted in the upper portion 69 of the housing of the generator, across from an axial vent hole 70 in a generator stator core. Hydrogen gas (indicated by arrows) 71 passes over the target means 30, which is mounted on the lower portion 72 of the housing. As can be seen in FIGS. 5 and 6, the target means 30 is mounted on a small angle so that the hydrogen gas impinges upon each of the target means to transfer heat to these targets more effectively.

It will be appreciated that the monitoring device 20 can be mounted anywhere adjacent to the stator core. Thus, temperature monitoring can be accomplished at any desired location. This is possible because the fiber optic cables 25, 26, and 34-37 are durable and electrically non-conductive, and because the light source means 22 and 23, photodiode means 38-41, and monitoring means 42 can be located away from the high temperature and voltages associated with the stator core.

An example of the application of the invention to a 819 megawatt inner cooled turbine generator will now be discussed. Typically, this generator would run normally at a temperature of 63°-70° C., with 90°-100° C. being a distress range where insulation would start to breakdown.

Preferably, the four targets 52-55 will be; (1) a no-load or low temperature condition indicator 52 which will allow light to pass through at ranges from room temperature to approximately 40° C. and which will block light from passing through at all other temperatures; (2) a full load condition indicator 53, which will allow light to pass through from the temperature ranges of 50° to 70° C. and which will block light from passing through at all other temperatures; (3) a high temperature indicator 54 which will allow light to pass through from 80° C. to 110° C. and which will block light from passing through at all other temperatures; and finally, (4) a verification target 55 which will allow light to pass through at all temperature ranges. A signal should always be received from this verification target 55. If no signal is received, the monitor 20 must be checked for malfunctions. The gaps in the temperature ranges from the different targets; i.e., from 40° C. to 50° C. and 70° C. to 80° C. will not effect the operation of the monitor as these temperatures are rarely maintained for sustained periods. Also, the monitoring means can be programmed to ignore temporary temperature readings in these ranges.

With these specific temperature ranges, the monitoring means 42 can monitor the specific temperatures in the generator. Also, the monitoring means 42 can monitor the various temperature indications taken over time. That is, in starting up the generator, target 52 (and of course, target 55) would allow light from fiber optic cables 25 and 26 to pass through for conversion by the photodiode means 38-41 and processing by the monitoring means 42. As the temperatures inside the generator core reach normal operating ranges of 63°-70° C. target 52 would block the light source, then target 53 will allow light to pass through. In the event of subsequent distress temperatures of 100° C., target 53 would then block light from passing through and target 54 would allow light to pass through. It would be at this point that the monitoring means 42 would indicate that desired temperatures in the generator are not being maintained.

It is to be noted that not only are the discrete temperature measurements important, but also the sequence of the various temperature measurements over time are indicative of changing conditions in the stator core. For example, with the generator operating at full load, if the following sequence of events occurs—light transmission through target 53, followed by a blockage of light through 53, followed by light transmission through 54, followed by a blockage of light through 54, followed by the transmission and subsequent blockage of light through 53, followed by the transmission of light through target 52—this would indicate that there has been a metal failure in the generator in which the axial holes are being sealed off such that no hydrogen gas would be able to pass over the monitor 20.

Figure 7:
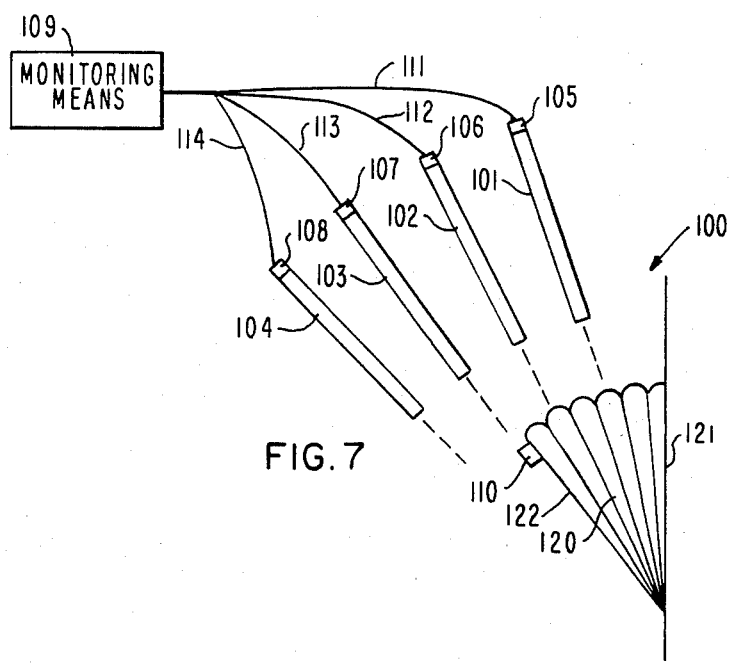
FIG. 7 is a partially schematic side view of an alternate embodiment of the invention.

FIG. 7 shows an alternate embodiment of the monitor 100. Here, preferably four fiber optic cable receivers 101-104 having associated photodiode means 105-108 associated with a monitoring means 109 similar to the monitoring means 42 described hereinbefore are positioned so as to selectively receive a light beam from one fiber optic emitter 110 positioned on a bladder means 120. The bladder 120 is made of resilient heat resistant material and is filled by a fluid having a known coefficient of thermal expansion. Thus, as the temperature increases in the core, the bladder 120 will expand.

The bladder 120 is anchored on one side 121 of the stator core, preferably near the axial vent hole as shown in FIGS. 5 and 6 and has a side 122 that is free to move from the anchored side in an arcuate path. The fiber optic emitter 110 is located on side 122. The various positions of the fiber optic emitter 110, which is free to move with the free side 122 of the bladder 120, correspond to the temperature of the vented gas. By calibrating the temperature versus the wall position and positioning the fiber optics accordingly, one can monitor the temperature. As the wall expands, it changes the amount of light received by each of the fiber optic receivers 101-104 from the fiber optic emitter 110. The light beams are first converted into electrical responsive signals by the photodiode means 105-108 and then the signals are delivered by respective conductors 111-114 to the monitoring means 109. The monitoring means 109 processes the signal and can output to a user information concerning the ambient temperature in the stator core.

This bladder 120 is small, and can be easily installed in several positions in the generator. Because of its size, it could also be inserted into the rotor slot allowing for monitoring of the rotor winding and/or rotor body temperature.

Figure 8:
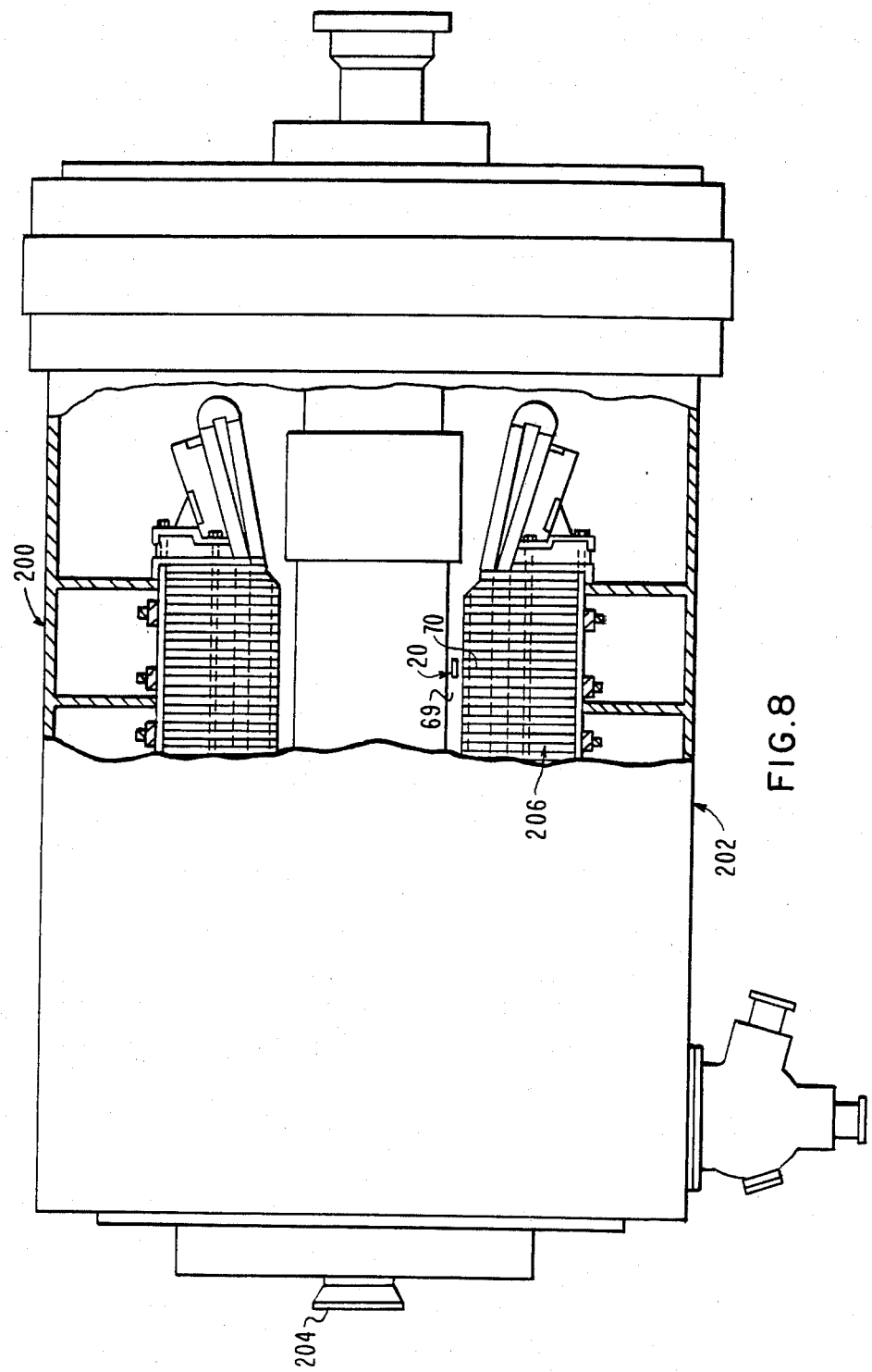
FIG. 8 is a vertical section through a radially cooled steam generator illustrating the positioning of the monitor.

FIG. 8 shows a vertical section through a radially cooled generator 200 illustrating a preferred positioning of the temperature monitor 20. Note that temperature monitor 100 described hereinabove may also be placed in the same manner as temperature monitor 20. The generator 200 consists basically of a frame 202, a rotor 204, and a stator core 206. The monitor 20 is preferably placed, as described hereinabove with respect to FIGS. 5 and 6, on the housing 69 near an axial vent hole 70. The foregoing positioning of the monitor 20 is not meant to limit the possible areas where the monitor 20 can be placed. The monitor can be placed anywhere near the stator core 206 for effective results.

It will be appreciated that a device for monitoring generator core temperatures is provided which uniquely combines a fiber optic system with thermally reversible plastic windows and monitoring means. The alternate embodiment combines the fiber optic system with an expandable bladder. Both embodiments facilitate quick and inexpensive retrofitting of temperature monitoring devices in generators.

Whenever a particular embodiment of the invention has been described above, for purposes of illustration, it would be evident to those skilled in the art that numerous variations of the details may be made without departing from the invention as defined in the appended claims.

I claim:

1. A temperature monitor for a generator stator core having cooling vent holes through which hydrogen gas passes comprising:

light source means which generate a light beam, heat sensitive target means mounted adjacent to said vent holes and exposed to said hydrogen gas which receive said light beam and which either block said light beam or allow said light beam to pass through, depending on the temperature in said stator core, receiver means associated with said target means which detects whether said light beam has passed through said target means or whether said light beam has been blocked by said target means and which converts said passed-through light beams into responsive electrical signals, and monitoring means which receives said responsive electrical signals from said receiver means, converts said responsive electrical signals into processed electrical signals, and outputs data to a user, whereby temperature conditions in said generator stator core can be monitored.

2. The monitor of claim 1, said light source means being a fiber optic system comprising light beam generating source means, light carrying means for carrying said light beam and outlet means for directing said light beam towards said target means.

3. The monitor of claim 2, said light beam generating source means being located away from said stator core, whereby said light beam generating source means is not exposed to temperature extremes and elevated voltage and magnetic flux fields in said stator core and whereby said light beam generating source means is easy to access for repair or replacement purposes.

4. The monitor of claim 2, said target means comprising target frame means, said target frame means containing a plurality of heat sensitive plastic targets facing said outlet means which will either block said light beams or allow light beams to pass through depending on the temperature of said hydrogen gas so that said receiver means can selectively convert said light beams to said responsive electrical signals.

5. The monitor of claim 4, one of said targets is a high temperature target which will allow said light beams to pass through when temperatures in said core are at high temperature distress levels and which will block said light beams from passing through at all other temperatures.

6. The monitor of claim 5, another of said targets being a full load condition target which will allow said light beams to pass through when temperatures in said core are within normal operating ranges and which will block said light beams from passing through at all other temperatures.

7. The monitor of claim 6, another of said targets being a verification target which will allow said light beams to pass through at all temperatures.

8. The monitor of claim 7, another of said targets being a low temperature condition target which will allow said light beams to pass through when said generator is not operating or is operating at below normal temperatures.

9. The monitor of claim 5, another of said targets being a verification target which will allow said light beams to pass through at all temperatures.

10. The monitor of claim 9, another of said targets being a low temperature condition target which will allow said light beams to pass through when said generator is operating at a below normal temperature.

11. The monitor of claim 6, another of said targets being a low temperature condition target which will allow said light beams to pass through when said generator is operating at a below normal temperature.

12. The monitor of claim 1, said receiver means including a fiber optic cable attached on one end to said target means and selectively receiving said light beams through said target means and attached on an opposite end to photodiode means which converts said light beam into a responsive electrical signal, said photodiode means being located away from said stator core, whereby said photodiode means is not exposed to temperature, voltage or magnetic flux field extremes in said stator core and whereby said photodiode means is easy to access for repair or replacement purposes.

13. The monitor of claim 12, said monitoring means including computer means which receives said responsive electrical signal from said receiver means, converts said responsive electrical signal into a processed electrical signal, and outputs data to a user based on the sequence of said responsive electrical signals, whereby temperature conditions in said generator stator core can be monitored.

14. A temperature monitor for a generator stator core comprising:
heat sensitive bladder means mounted on said core having attached thereon a fiber optic emitter means which generates a light beam,
fiber optic receiver means which are positioned so as to receive said light beam and which convert said light beam into responsive electrical signals,
said heat sensitive bladder means containing a fluid having a high coefficient of thermal expansion, whereby changes in the temperature of said stator core will cause said fluid to expand and contract and thus cause said bladder means to expand and contract accordingly, so that said light beam selectively impinges on said receiver means, and
monitoring means which receives said responsive electrical signals from said fiber optic receiver means, converts said responsive electrical signals into processed electrical signals and outputs data to a user, whereby temperature conditions in said generator stator core can be monitored.

15. The monitor of claim 14, said bladder means having a fixed end and a movable end, said fixed end being secured to said core and said movable end having said fiber optic emitter means attached thereto.

16. The monitor of claim 15, said monitoring means including computer means which receives said responsive electrical signals from said fiber optic receiving means, converts said responsive electrical signals into a processed electrical signal, and outputs data to a user based on the sequence of said responsive electrical signals, whereby temperature conditions in said generator stator core can be monitored.

17. A monitor for determining temperature in a selected location comprising
fiber optic light source means which generates a light beam,
receiver means for selectively receiving said light beam,
heat sensitive means which selectively directs said light beam to said receiver means based on the temperature in said selected location,
said receiver means receiving said light beam and converting said light beam into responsive electrical signals,
said light source means and said receiver means located away from said selected location and fiber optic cable means for conducting said light beam from said light source means and conducting said selectively directed light beam from said receiver means, and
monitoring means which receives said responsive electrical signals from said receiver means, converts said responsive electrical signals into processed electrical signals and outputs data to a user based on the sequence of said responsive electrical signals, whereby temperature conditions can be monitored.

18. The monitor of claim 17, said heat sensitive means including cholestric liquid crystal target means which respond to changes in temperature by the blockage or transmission of the visible light spectrum.

19. The monitor of claim 17, said heat sensitive means including bladder means mounted in said selected location.

* * * * *